United States Patent [19]
Garnett et al.

[11] Patent Number: 5,783,963
[45] Date of Patent: Jul. 21, 1998

[54] ASIC WITH SELECTABLE OUTPUT DRIVERS

[75] Inventors: Sean Foster Garnett, Lexington; Terry Lee Parker, Versailles; John Parker Richey; Warren John Spina, both of Lexington; Larry Wayne True, Georgetown, all of Ky.

[73] Assignee: Lexmark International, Inc., Lexington, Ky.

[21] Appl. No.: 608,902

[22] Filed: Feb. 29, 1996

[51] Int. Cl.$^6$ .................. H03H 11/28; H03K 3/01
[52] U.S. Cl. .................. 327/306; 327/309; 327/319; 327/407; 327/170; 326/86; 326/30
[58] Field of Search .................. 327/108, 379, 327/387, 388, 403, 407, 408, 306, 319, 333, 309, 170; 326/21, 27, 56, 30, 86

[56] References Cited

U.S. PATENT DOCUMENTS

| | | | |
|---|---|---|---|
| 5,107,230 | 4/1992 | King | 326/56 |
| 5,162,672 | 11/1992 | McMahan et al. | 326/86 |
| 5,294,845 | 3/1994 | McMahan et al. | 307/443 |
| 5,319,258 | 6/1994 | Ruetz | 307/443 |
| 5,361,003 | 11/1994 | Roberts | 326/21 |
| 5,418,911 | 5/1995 | Zilka et al. | 326/56 |
| 5,479,123 | 12/1995 | Gist et al. | 327/108 |

FOREIGN PATENT DOCUMENTS

| | | | |
|---|---|---|---|
| 4103143 | 4/1992 | Japan | 326/56 |

*Primary Examiner*—Timothy P. Callahan
*Assistant Examiner*—Dinh T. Le
*Attorney, Agent, or Firm*—John A. Brady

[57] ABSTRACT

An ASIC (5) has four driver circuits (19a–19d), each with different output power. One of those driver circuits is selected from the content of register (13) on the ASIC. The register content being decoded by a decoder (15) on the ASIC to a signal which activates a single one of the drivers. The register is loaded from an external microprocessor during each initialization of a printer (1) in which the ASIC is a component. The ASIC is designed with the range of the powers of the drivers bracketing the estimated needs of the load to be attached to the ASIC. This permits the ASIC to be completed only once, while the most suitable driver for the final load is determined subsequently and selected by the entry of data to activate that driver into the register with each initialization of the printer. The ASIC need not have non-volatile memory and only a single set of ASIC masks and other design aspects need be completed.

4 Claims, 1 Drawing Sheet

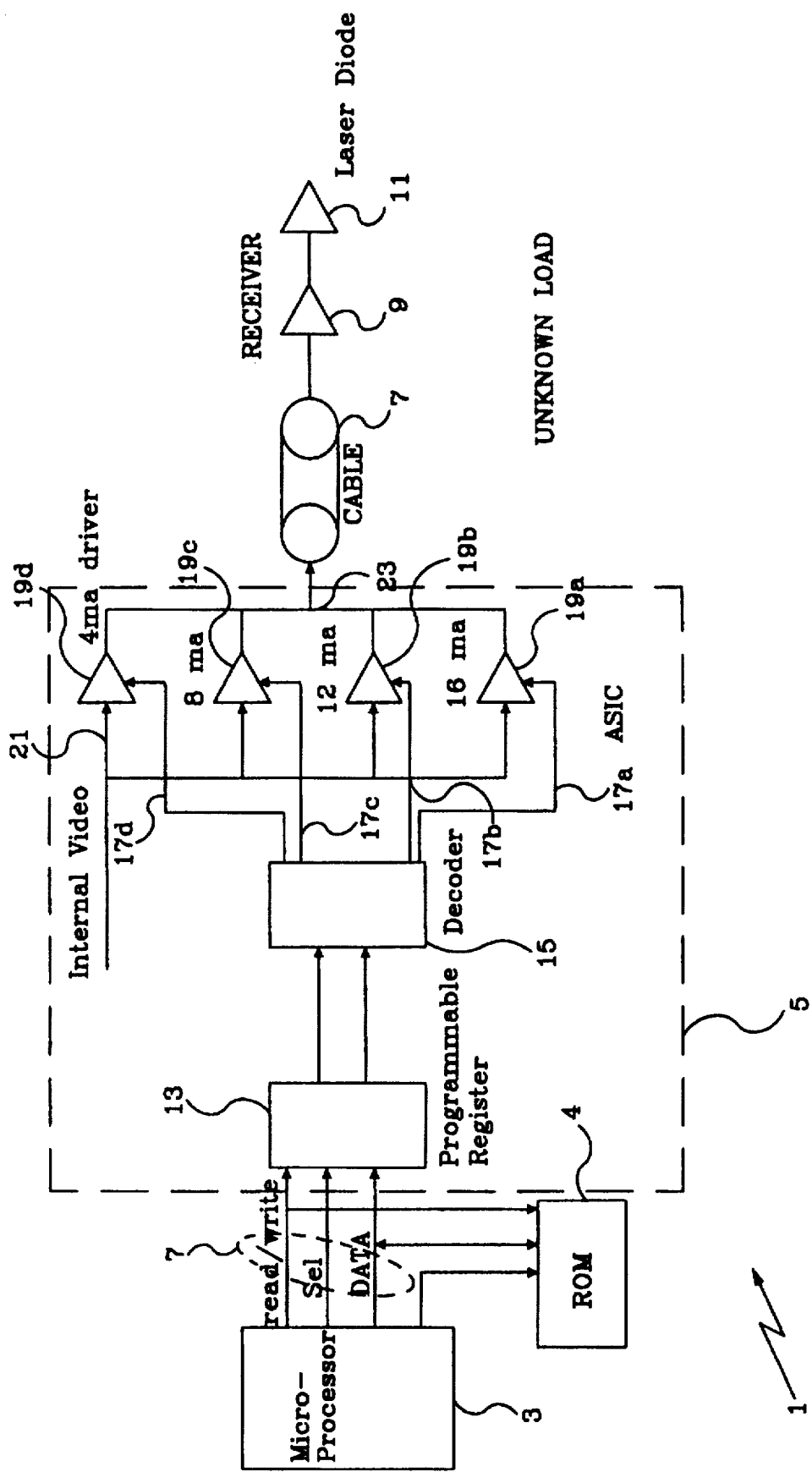

ASIC WITH SELECTABLE OUTPUT DRIVERS

TECHNICAL FIELD

This invention relates to integrated circuits, commonly known as Application Specific Integrated Circuits, or ASIC's, and the design of such circuits with output drivers having good performance with low electrical noise.

BACKGROUND OF THE INVENTION

Integrated circuits are formed on a single substrate, normally silicon, by a number of applications of materials, such a dopants to form electrical junctions, and layers, such as thick film layers to form resistors. These applications are done in multiple stages, generally through masks or patterns, which must be very precise and detailed. Thus, a high initial expense is required to make the masks and patterns required for a specific integrated circuit. Once these are made, production of large quantities of the circuit is relatively inexpensive.

An integrated circuit normally has at least one output driver circuit to deliver to other apparatus the results of the information processing of the integrated circuit. Often the signal from the driver must be transmitted to another electrical circuit spaced from the integrated circuit significantly. Transmittal of such signals over an electrical path at high bit rates or frequencies within the signal can result in significant radiation, which is electromagnetic noise and is undesirable.

The load elements to be driven by such signals can be virtually impossible to estimate with great accuracy. In view of such uncertainty, in specifying the driver of an ASIC to drive the load, the designer will err on the high side of power out from the ASIC to be sure it is sufficient to drive the load. This assures driving of the load, but the excess power reaching the load is reflected back to cause ringing, which produces electromagnetic noise, and possible malfunctions.

This invention provides for the ASIC driver to be selectable so that the power during use is more closely matched to that just needed. U.S. Pat. No. 5,319,258 to Ruetz has selectable, parallel drivers and has a read only memory to select the drivers, but not in the context of an ASIC. U.S. Pat. No. 5,162,672 to McMahan et al and its continuation, U.S. Pat. No. 5,294,845, also has selectable drivers and storage device to select the drivers, but not in the context of an ASIC. U.S. Pat. No. 5,479,123 to Gist et al has an ASIC with selectable impedance. U.S. Pat. No. 5,361,003 to Roberts has a driver circuit on a chip which may be adjusted for speed and power at manufacturer by an special input or by blowing a fuse.

DISCLOSURE OF THE INVENTION

In accordance with this invention an ASIC has multiple driver circuits, each providing different output power, serving a single output of the ASIC. A single one of those driver circuits is selected from a register on the ASIC, and the register on the ASIC is loaded by an external data processor during initialization of the apparatus in which the ASIC is a functional component, which avoids the need for nonvolatile storage on the ASIC. The ASIC designer specifies, for example, four drivers with different output powers bracketing the estimated needs of the load to be attached to the ASIC. In a trial and error operation during design of the device for which the ASIC is a component, the closest of the four drivers is found. The input to the control register will be that to select that closest driver. No more than one of the four drivers be selected as they will interact unless the timing is virtually perfect, which can not be assured.

BRIEF DESCRIPTION OF THE DRAWING

The details of this invention will be described in connection with the drawing, which is illustrative of the elements of this invention.

BEST MODE FOR CARRYING OUT THE INVENTION

FIG. 1 shows this invention employed in a laser printer 1. Printer 1 is under the overall control of a general purpose microprocessor 3, as is now conventional. Microprocessor 3 is controlled by stored program instructions in a ROM 4, a permanent memory, as is also conventional. Microprocessor 3 supplies data and control signals to ASIC 5 on bus 7. Since microprocessor 3 and ASIC 5 are physically close together, communication between them produces little noise, as longer connections act as antennas.

ASIC 5 is an integrated circuit formed on a single, silicon substrate, as is conventional. ASIC 5 acts as combinational and sequential, special purpose logic circuitry to implement a predetermined function, and does not have the general purpose capabilities of microprocessor 3. Moreover, ASIC's are typically very complex, having a large number of active devices, such as transistors, all integrated on one semiconductive substrate. A wide variation of fabrication and implementation of combinational logic is known, virtually all of which may be employed with this invention.

In this specific embodiment, ASIC 5 receives from microprocessor 3 and then stores lines of image data as off and on bits, each bit representative of a pel location on the image being printed. A 9 row by 9 column segment of contiguous bit data is analyzed with respect to each pel located in the middle of the 9 by 9 segment, and the modulation of that pel in final printing is determined by the combinational logic of ASIC 5.

This signal for each pel is delivered to control laser diode 11 through a several-inch long connecting lines of conductive cable 7, to a buffer circuit 9, which controls the off and on operation of laser diode 11, the light source for printing. Laser diode 11 has the capability of being turned off and on to provide four contiguous pulses for printing while the light from laser diode 11 sweeps one pel width of 1/600 inch during the printing operation.

This control operation by ASIC 5 is to improve the image by smoothing diagonal lines, sometimes known as enhancement of resolution. Since such function precedes this invention and forms no part of it, it will not be described in further detail.

Register 13 is a storage circuit for two bits. Register 13 is part of ASIC 5. It is reached by microprocessor 5 supplying a predetermined code to the input of ASIC 5 (generally termed addressing), after which two bits of data are supplied by microprocessor 5 which are entered into register 13, where they are then stored. Registers are entirely conventional, and register 5 may be implemented in virtually any manner.

The contents of register 13 are directly connected as input signals to decoder 15, which is also a part of ASIC 5. Decoder 15 may be any logical circuit to produce a different output for each of the combinations of two bits in register 13. Thus, if no bits are on in register 13, decoder 15 will produce, for example, a signal on line 17a and no signal on lines 17b, 17c and 17d. If the first bit is on and the second bit is off in register 13, decoder 15 will produce a signal on line 17b and no signal on lines 17a, 17c, and 17d. If the second bit is on and the first bit is off in register 13, decoder 15 will produce a signal on line 17c and no signal on lines 17a, 17b, and 17d. Finally, if both bits are on in register 13, decoder 15 will produce a signal on line 17d and no signal on lines 17a, 17b, and 17c. Lines 17a through 17d are part of ASIC 5.

An "on" signal on lines 17a through 17d activates the driver 19a through 19d to which the line 17a through 17d is attached. Drivers 19a through 19d having an "off" signal on the line 17a through 17d to which it is attached are not activated. Each of drivers 19a through 19d are structured to provide different levels of power at their output. Specifically, in this embodiment, drivers 19a through 19d comprise field effect transistors which differ in physical width. In so differing, the wider transistors provide less internal resistance and so provide more power at their outputs. Conventionally, this is described in terms of assured current capacity under specified operating conditions. In this embodiment driver 19a is a 16 ma driver, driver 19b is a 12 ma driver, driver 19c is an 8 ma driver, and driver 19d is a 4 ma driver. The input signal to drivers 19a through 19d on connector 21 is received from the combinational logic of ASIC 5. The output of drivers 19a through 19d are tied together and connected to an output terminal 23. Drivers 19a through 19d and their connection to output terminal 23 are a part of ASIC 5.

Prior to specifying the design of ASIC 5, the load characteristics to be seen by terminal 23 are determined using standard measuring and estimating techniques. Great accuracy in determining this expected load is not obtained because the laser mechanism is typically being developed at the same time. Along with the functional design of ASIC 5 for its primary purpose, the four driver circuits 19a through 19d are specified at values in a range extending generally the same amount on both sides of that which is correct for the expected load. With reference to the specific values of 4 ma to 16 ma stated above, the expected load would be that for a driver of between 8 and 12 ma.

The best of the four drivers 19a through 19d in actual operation is then determined by controlled operation and measuring the results, or by other observations of the actual characteristics of the final load. The lowest power is selected which assures full operation of the laser diode 11 during functioning of printer 1. A higher power would provide more energy to be reflected back and produce radiation noise from the lines of cable 7 being long enough to act as an antenna for electromagnetic radiation from signals connected through the lines of cable 7.

When the driver is selected, which might be driver 19b, the code in ROM 5 where it specifies the signal controlling register 13, is given the information to load into register 13 the code to select the driver 19b, which for driver 19b is one then zero in the foregoing example. Where a different driver 19a through 19d is selected by observations of actual operation as just described, the code for selection of that different driver is entered into ROM 5.

After so defining the code in ROM 5, that code is never changed during the normal life of the product. At each turn-on of printer 1 microprocessor 5 and ASIC 5 are powered electrically, where during turn off of printer 1 they are without power. Register 13 has lost its information. As is conventional, microprocessor 5 begins an initialization operation (generally termed power on reset) to begin operation. In accordance with this invention, loading register 13 with the proper code as above described is incorporated into the initialization. In this manner only a single ASIC design was finalized while a selection of drivers of different power permits use of a driver correct or close to correct for the particular application. Since creating a completed ASIC is relatively very expensive, while duplicating the ASIC is then very inexpensive, the ability to control noise while building identical ASIC's only one ASIC of one design is manifest.

Variation within the spirit and scope of this invention will be apparent and can be expected. Except for the unique aspects as described, the content and manufacture of the ASIC is not important to this invention and may take various forms known or to become known in the future.

We claim:

1. A method of making an Application Specific Integrated Circuit (ASIC) for control of an apparatus with the reduction of electromagnetic noise from signals from an output of said ASIC comprising the steps of:

estimating a lowest power required by a load of said output of said ASIC when said ASIC is functioning in said apparatus, and obtaining for use in said apparatus identical ASIC's comprising special purpose logic circuitry to implement a predetermined function by processing signals input to said ASIC and providing output signals, each of said ASIC's having a plurality of drivers, each driver of said plurality of drivers receiving a signal input to each of said drivers and providing an output signal, said output signal of each of said drivers being of a different power than the output signal each of of the additional ones of said plurality of drivers a the range of said powers including a correct power for said estimated load to reduce electromagnetic noise when driving said estimated load, said output signals of said special purpose logic being connected to provide output signals input to said drivers, said drivers being selectable for operation or not operation by a predetermined signal to a control input for each driver, and a register to store code signals in said register and to provide output signals unique to the code signals stored in said register, said output signals of said register being connected to said control inputs of said drivers to select for operation one of said drivers.

2. The method as in claim 1 in which said range extends generally the same amount on both sides of said estimated power required by said estimated load.

3. The method as in claim 1 also comprising the steps of determining the code to enter into each said ASIC for selection of one of said drivers by observing an actual load and entering said code in said register.

4. The method as in claim 2 also comprising the steps of determining the code to enter into each said ASIC for selection of one of said drivers by observing an actual load and entering said code in said register.

* * * * *